US008957316B2

(12) United States Patent
Fields et al.

(10) Patent No.: US 8,957,316 B2
(45) Date of Patent: Feb. 17, 2015

(54) ELECTRICAL COMPONENT ASSEMBLY FOR THERMAL TRANSFER

(75) Inventors: Chris R. Fields, Tampa, FL (US); Jerry Keller, Bradenton, FL (US)

(73) Assignee: Honeywell International Inc., Morristown, NJ (US)

( * ) Notice: Subject to any disclaimer, the term of this patent is extended or adjusted under 35 U.S.C. 154(b) by 832 days.

(21) Appl. No.: 12/879,229

(22) Filed: Sep. 10, 2010

(65) Prior Publication Data

US 2012/0061127 A1     Mar. 15, 2012

(51) Int. Cl.
| H05K 1/00 | (2006.01) |
| H01L 23/42 | (2006.01) |
| H01L 23/373 | (2006.01) |
| H01L 23/433 | (2006.01) |

(52) U.S. Cl.
CPC .............. *H01L 23/42* (2013.01); *H01L 23/373* (2013.01); *H01L 23/433* (2013.01); *H01L 23/4338* (2013.01); *H01L 2924/0002* (2013.01)
USPC ............ 174/252; 174/718; 361/690; 361/694

(58) Field of Classification Search
USPC ........................... 174/252, 718; 361/690, 694
See application file for complete search history.

(56) References Cited

U.S. PATENT DOCUMENTS

| 5,844,784 | A | * | 12/1998 | Moran et al. ................... 361/818 |
| 5,946,191 | A | | 8/1999 | Oyamada |
| 6,181,556 | B1 | * | 1/2001 | Allman ........................... 361/690 |
| 6,223,815 | B1 | | 5/2001 | Shibasaki |
| 6,249,435 | B1 | | 6/2001 | Vicente et al. |
| 6,400,565 | B1 | * | 6/2002 | Shabbir et al. ........... 361/679.54 |
| 6,750,084 | B2 | * | 6/2004 | Delheimer ...................... 438/117 |
| 6,917,525 | B2 | | 7/2005 | Mok et al. |
| 7,019,266 | B1 | * | 3/2006 | Motakef et al. ............... 219/413 |

(Continued)

FOREIGN PATENT DOCUMENTS

| JP | 61290743 | 12/1986 |
| JP | 05047968 | 2/1993 |

OTHER PUBLICATIONS

Cluff, K.D. et al., "Electronic Packaging Technologies," Mechanical Engineering Handbook, 21 pp., 1999, downloaded on Sep. 10, 2010, http://citeseerx.ist.psu.edu/viewdoc/download?doi=10.1.1.119.4720&rep=rep1&type=pdf.

European Search Report from counterpart European application No. 11180649.3, dated Aug. 21, 2013, 6 pp. (Atty. docket no. H0026935-5806/1121-297EP01).

(Continued)

*Primary Examiner* — Andargie M Aychillhum
(74) *Attorney, Agent, or Firm* — Shumaker & Sieffert, P.A.

(57) ABSTRACT

Example electrical component assemblies are described. In some examples, the electrical component assembly may include a printed board and an electrical component on the printed board, the electrical component defining a first surface adjacent the printed board and one or more second surfaces other than the first surface. The assembly may also include a thermal bridge comprising a plurality of vias extending through the thermal bridge, and a thermally conductive member interposed between the one or more second surfaces of the electrical component and the thermal bridge. In some examples, the thermally conductive member extends at least partially through the plurality of vias of the thermal bridge. During operation of the electrical component, the assembly configuration may facilitate thermal transfer from a first direction defined by the thermally conductive member to a second direction defined by the thermal bridge to transfer thermal energy away from a surface of the electrical component.

20 Claims, 6 Drawing Sheets

(56) References Cited

U.S. PATENT DOCUMENTS

| | | | |
|---|---|---|---|
| 7,187,076 B2 | 3/2007 | Cuff et al. | |
| 7,187,083 B2 * | 3/2007 | Lewis et al. | 257/772 |
| 7,289,328 B2 | 10/2007 | Belady et al. | |
| 7,327,569 B2 | 2/2008 | Belady et al. | |
| 7,349,221 B2 | 3/2008 | Yurko | |
| 2006/0104034 A1 | 5/2006 | Tsai et al. | |
| 2007/0046304 A1 | 3/2007 | Mok et al. | |
| 2009/0002950 A1 * | 1/2009 | Gertiser et al. | 361/709 |
| 2011/0228484 A1 * | 9/2011 | Sundstrom et al. | 361/718 |

OTHER PUBLICATIONS

European Extended Search Report and Opinion from counterpart European application No. 11180649.3, dated Oct. 28, 2013, 10 pp. (Atty. docket no. H0026935-5806/1121-297EP01).

Examination Report from counterpart European application No. 11180649.3, dated Jan. 27, 2014, 7 pp. (Atty. docket no. H0026935-5806/1121-297EP01).

Response to Examination Report dated Jan. 27, 2014, from counterpart European Application No. 11180649.3, filed Jul. 29, 2014, 11 pp.

* cited by examiner

ELECTRICAL COMPONENT ASSEMBLY FOR THERMAL TRANSFER

TECHNICAL FIELD

This disclosure relates to electrical components and, more particularly, to electrical components mounted on a printed board.

BACKGROUND

An electrical component can be mounted on a printed board. The printed board can provide mechanical support for the electrical component, allowing the electrical component to be physically incorporated into an electronic device. The printed board can also provide electrically connectivity, allowing the electrical component to be electrically integrated into an electronic device. In some examples, multiple electrical components can be mounted on a printed board to create an electrical network of interconnected electrical components. The interconnected electrical components can provide one or more paths for electrical current to flow, thereby defining one or more electrical circuits. During operation, electrons may flow through the electrical component mounted on the printed board. This may generate heat as electrical energy is converted into thermal energy.

SUMMARY

In general, the disclosure is directed to an electrical component assembly that provides a thermal transfer pathway for transferring heat through one or more surfaces of an electrical component. In some examples, the electrical component may be disposed on a substrate (e.g., a printed board) to define a bottom surface adjacent the substrate and a top surface opposite the bottom surface. A thermal bridge may be thermally connected (e.g., via a conductive pathway) to at least a portion of the top surface of the electrical component to provide a thermal pathway for transferring heat away from the top surface of the electrical component. The thermal bridge may include one or more vias extending at least partially through the thermal bridge. In some examples, the assembly includes one or more thermally conductive members interposed between the top surface of the electrical component and the thermal bridge for thermally connecting the electrical component to the thermal bridge. In some examples, the one or more thermally conductive members extend at least partially through the one or more vias of the thermal bridge. In this manner, assemblies of the disclosure may, in some examples, transfer thermal energy from a first direction defined by one or more thermally conductive members to a second direction defined by the thermal bridge to remove heat from the electrical component.

In one example according to the disclosure, an assembly includes a printed board and an electrical component on the printed board, the electrical component defining a first surface adjacent the printed board and one or more second surfaces other than the first surface. The assembly also includes a thermal bridge comprising a plurality of vias extending through the thermal bridge and a thermally conductive member interposed between the one or more second surfaces of the electrical component and the thermal bridge.

In another example according to the disclosure, an assembly includes a printed board and an electrical component on the printed board, the electrical component defining a first surface adjacent the printed board and one or more second surfaces other than that of the first surface. The assembly also includes a thermal bridge comprising a plurality of vias extending through the thermal bridge, the thermal bridge comprising a thermally orthotropic material, and the plurality of vias comprising plated vias, and a thermal connector comprising a plurality of projections extending at least partially through the plurality of vias, the thermal connector comprising a thermally isotropic material. In addition, the assembly includes a thermal interface interposed between the top surface of the electrical component and the thermal connector.

In yet another example according to the disclosure, a method includes placing a thermally conductive member over an electrical component on a printed board, the electrical component defining a first surface adjacent the printed board and one or more second surfaces other than the first surface, and placing a thermal bridge over the electrical component, the thermal bridge comprising a plurality of vias extending through the thermal bridge.

The details of one or more examples are set forth in the accompanying drawings and the description below. Other features, objects, and advantages will be apparent from the description and drawings, and from the claims.

DETAILED DESCRIPTION

Electrical components can be incorporated into a variety of different electrical circuits and a variety of different electrical devices. In some examples, an electrical assembly includes one or more electrical components mounted on a substrate (e.g., a printed board). The substrate provides mechanical support and electrical connectivity for the one or more electrical components. The one or more electrical components may be one or more discrete components, one or more integrated circuit (IC) components, or a combination of one or more discrete components and one or more IC components. Discrete components are individual circuit elements, such as transistors, diodes, resistors, capacitors, inductors, and the like. IC components, by contrast, contain two or more circuit elements in single circuit package. More complex circuits can be formed by electrically connecting multiple discrete components, multiple IC components, or a combination of discrete components and IC components.

During operation of an electrical assembly, the one or more electrical components mounted on the substrate may generate thermal energy. Specifically, power dissipation associated with an electrical current moving through the one or more electrical components may cause the one or more electrical components to increase in temperature. Effectively dissipating the thermal energy generated by the one or more electrical components (e.g., by transferring it away from the electrical component) may improve the performance of the one or more electrical components by, for example, lowering the impedance of the electrical components and increasing the reliability the electrical components relative to an assembly in which heat is not effectively dissipated.

In general, an electrical component includes several different surfaces that provide thermal transfer pathways for transferring thermal energy away from the component. With mounted components, for example, an electrical component may define a bottom surface adjacent a printed board and a top surface opposite the bottom surface. In some examples, thermal energy may be removed from the bottom surface of the electrical component using the leads of the electrical component and thermally conductive portions of the printed board to transfer thermal energy away from the electrical component. On the other hand, because thermal energy transfer may be limited, e.g., by the thermal conductivities of materials thermally connected to the bottom surface of the electrical component, thermal energy may additionally or alternatively be removed from the top surface of the electrical component. This topside cooling may, e.g., increase the density with which electrical components can be attached to a printed board and/or improve the performance of an electrical component by reducing its operating temperature.

In accordance with the present disclosure, assemblies for electrical component thermal energy transfer are disclosed. An example assembly may include a thermal bridge thermally connected to at least a portion of one or more surfaces of an electrical component to provide a thermal pathway for transferring heat away the electrical component through those surface(s). The thermal bridge may include one or more vias extending at least partially through the thermal bridge adjacent the surface of the electrical component. The one or more vias in the thermal bridge may provide for increased transfer of thermal energy across the surface of the electrical component into the thermal bridge, e.g., as compared to a thermal bridge that includes a solid, substantially planar surface adjacent the surface of the electrical component.

In some examples, the assemblies may also include one or more thermally conductive members interposed between the one or more surfaces of the electrical component and the thermal bridge. In combination, the one or more thermally conductive members may be in contact with both the surface(s) of the electrical component and a surface of the thermal bridge proximate to the one or more vias in the thermal bridge. In this manner, the one or more thermally conductive members may provide for conductive heat transfer from the electrical component to the thermal bridge in the area of the vias by way of the one or more thermally conductive members.

In some examples, the one or more thermally conductive members may extend at least partially through the one or more vias of the thermal bridge to increase the transfer rate of the thermal energy into the thermal bridge. The thermal energy may then follow the thermal pathway defined by the thermal bridge to remove the energy from the electrical component. This thermally pathway may be substantially orthogonal to the direction of thermal transfer into the thermal bridge by way of the one or more vias. For example, an example assembly may be configured such that thermal energy transferred by way of the one or more vias may follow a thermal pathway that is substantially orthogonal to the plane of the adjacent electrical component surface, while the thermal energy transferred within the thermal bridge may follow a thermal pathway that is substantially parallel to the plane of the adjacent electrical component surface.

In some examples, the thermal bridge may include a thermally orthotropic material, e.g., in combination with a thermally conductive member formed of thermally isotropic material. In general, a thermally isotropic material may exhibit substantially equal thermal conductivities in every direction while a thermally orthotropic material exhibits a thermal conductivity in one direction that is different from a thermal conductivity in at least one other direction. In examples where the thermal bridge is formed of a thermally orthotropic material, the one or more vias in the thermal bridge may provide for thermal energy transfer in a direction of lower thermal conductivity within the thermal bridge. This energy may then be transfer within the thermally orthotropic thermal bridge in the one or more directions having higher thermal conductivity.

Conceptual details for an example method for forming one example electrical component assembly will be described in greater detail with reference to FIG. 6. However, example electrical component assemblies including a thermal bridge and a thermally conductive member will first be described with reference to FIGS. 1-5.

Figure 1:
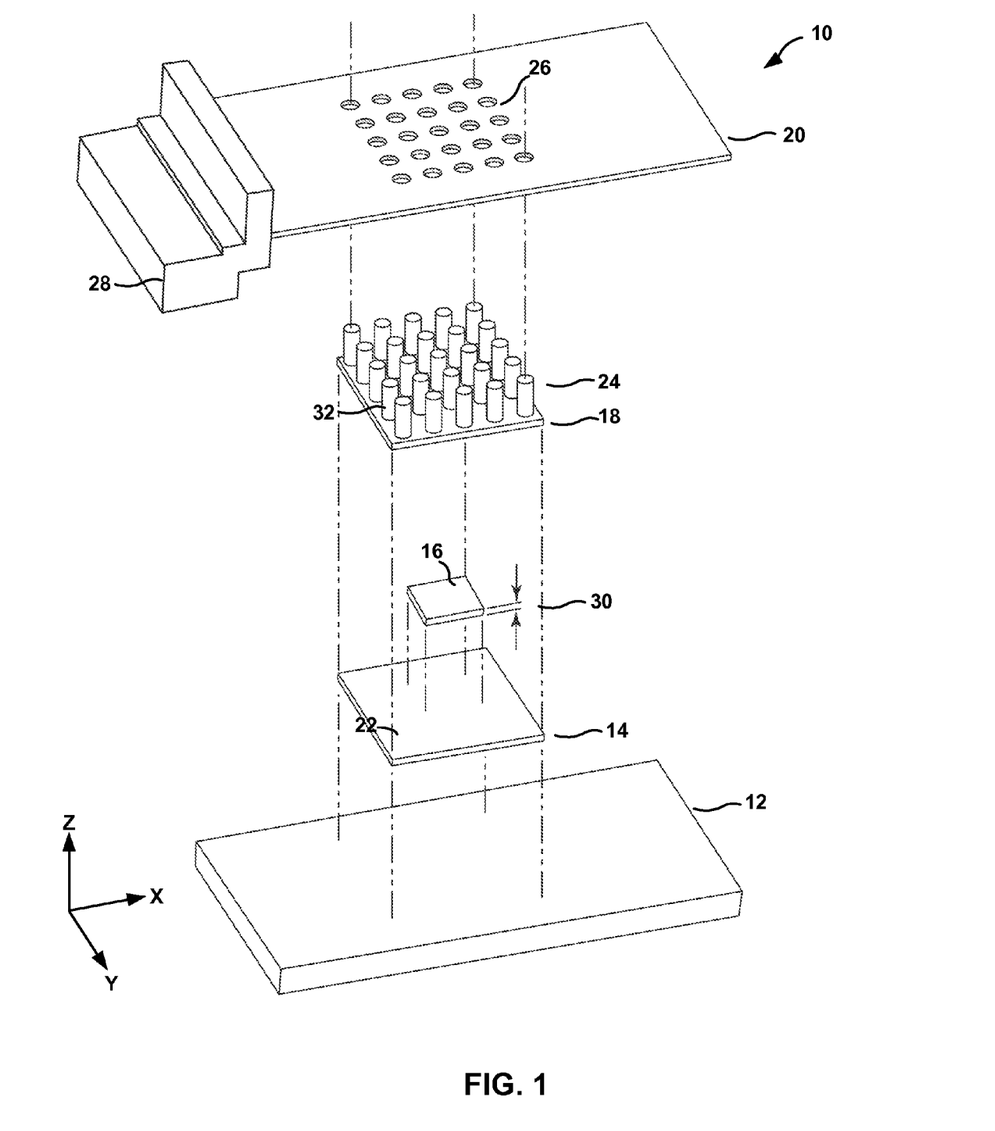
FIG. 1 is a conceptual diagram illustrating an exploded view of an example electrical component assembly that includes an electrical component, a thermal bridge, and one or more thermally conductive members.
Figure 2:
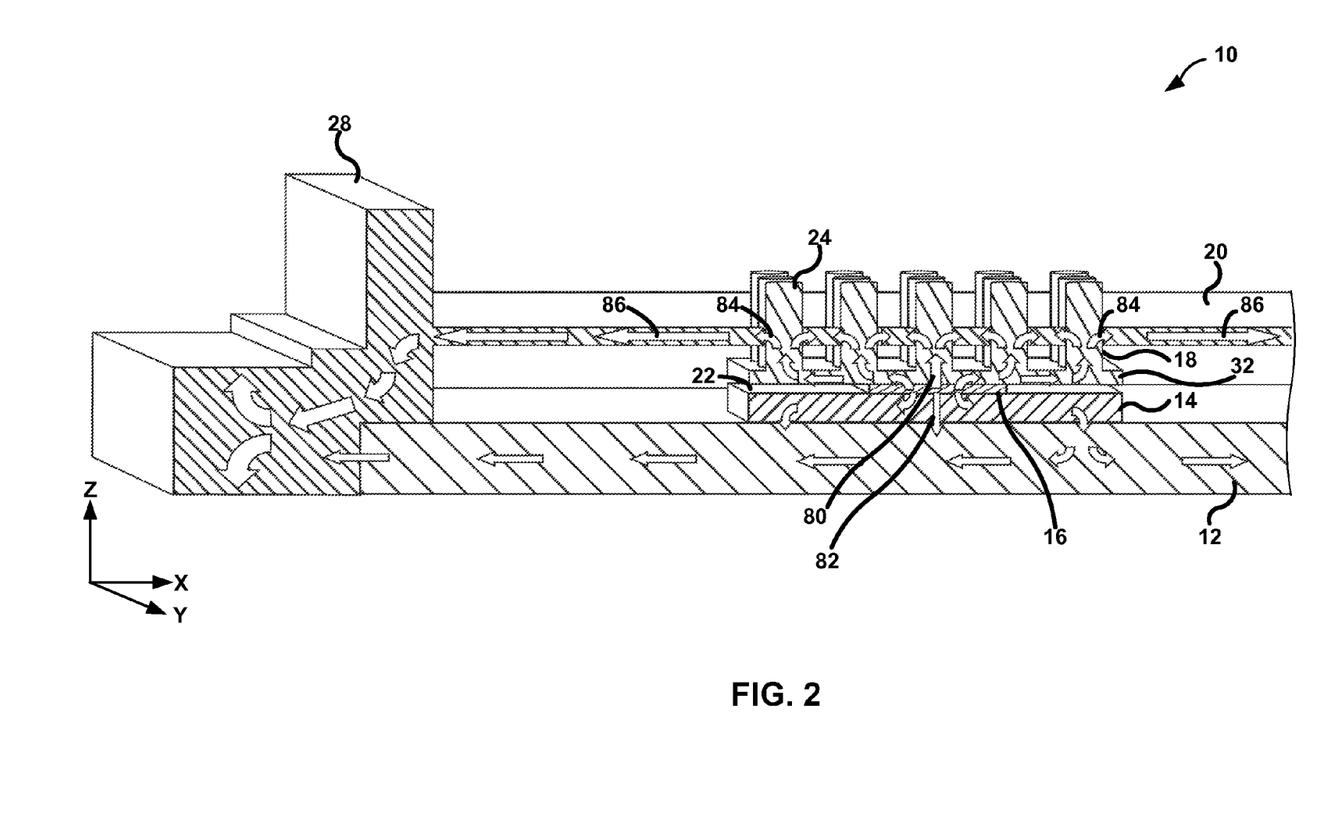
FIG. 2 is a schematic cross-sectional view of the example assembly of FIG. 1 showing example thermal transfer pathways.

FIG. 1 is a conceptual diagram illustrating an exploded view of an example electrical component assembly 10. FIG. 2 is a schematic cross-sectional view of example assembly 10 in an assembled state showing example thermal transfer pathways within assembly 10. The view of assembly 10 in FIG. 2 is shown along a cross-section bisecting a row of vias 26 in the x-z plane.

As shown, electrical component assembly 10 includes printed board 12, electrical component 14, thermal interface material (TIM) 16, thermal connector 18, thermal bridge 20, and mounting member 28. Electrical component 14 defines a top surface 22 and a bottom surface opposite the top surface 22 that is connected to printed board 12. TIM 16 is interposed between top surface 22 of electrical component 14 and thermal connector 18. Base 32 of thermal connector 18 is interposed between thermal bridge 20 and TIM 16. Mounting member 28, which is coupled to thermal bridge 20 and printed board 12, may be used to mount assembly 10 in an electrical device. As shown, thermal connector 18 includes a plurality of projections 24 and thermal bridge 20 includes a plurality of vias 26 (vias 26 not labeled in FIG. 2). For ease of illustration, only a single projection 24 and single via 26 are labeled in FIG. 1, although the plurality of projections 24 and the plurality of vias 26 of thermal bridge 20 may be collectively referred to herein in some instances as "projections 24" and "vias 26," respectively.

When assembly 10 is assembled as shown in FIG. 2, the bottom surface of TIM 16 may be in contact with top surface 22 of electrical component 14. Similarly, at least a portion of the top surface of TIM 16 may be in contact with the opposing (bottom) surface of electrical connector 18. In this manner, thermal energy may be conducted out of electrical component 12 through top surface 22 into TIM 16. From TIM 16, the thermal energy may then be conducted into electrical connector 22 across the surface interface with TIM 16. From thermal connector 22, the thermal energy then is transferred into thermal bridge 20 from protrusions 24 within vias 26. When assembled, one or more of projections 24 of thermal connector 18 may extend at least partially, and in some examples fully (as shown in FIG. 2), through vias 26 in thermal bridge 20. Vias 26 extend through thermal bridge 26 in approximately the z-direction (as labeled in FIGS. 1 and 2) to define a plurality of apertures in thermal bridge 20.

As will be described further below, thermal energy may be conductively transferred out of electrical component 14 to reduce the temperature of electrical component. For example, during operation of electrical component 14, thermal energy may be transferred out of electrical component across top surface 22 into thermal bridge 20 by way of TIM 16 and thermal connector 18. For ease of description, the example assemblies described herein will primarily be described with regard to the removal of thermal energy associated with electrical component 14 using thermal bridge 20 as being transferred across the surface of electrical component 14 opposite the surface directly adjacent printed board 12 or other mounting substrate. In assembly 10, that surface is top surface 22 of electrical component 14. However, examples of the disclosure are not limited as such. Rather, the described configurations may be utilized to remove thermal energy through any surface (e.g., a top surface and/or one or more side surfaces) of a thermal component using thermal bridge 20.

As illustrated in FIG. 2, thermal energy that is conductively transferred from electrical component 14 to thermal connector 18 through TIM 16 may then be transferred to thermal bridge 20. Thermal bridge 20 receives at least a portion of the thermal energy transferred from thermal connector 18 through vias 26. In the example of FIGS. 1 and 2, projections 24 of thermal connector 18 guide the transferred thermal energy into vias 26 of thermal bridge 20. In this manner, thermal energy is conducted in the z-direction within vias 26 such that the thermal energy transferred into thermal bridge 20 at various locations along the thickness (z-direction dimension) of thermal bridge 20, e.g., as opposed to substantially all of the thermal energy being conducted into a thermal bridge 20 at a single location in the z-direction defined by the bottom surface of thermal bridge 20 (the surface opposing top surface 22 of electrical component 14). Such a configuration may increase the rate of thermal energy transfer into thermal bridge 20, e.g., as compared to an example in which thermal bridge 20 does not include vias 26 but instead defines a substantially planar bottom surface.

As noted above, assembly 10 includes printed board 12, and in some cases may be referred to as a printed board assembly (PBA), printed wiring assembly (PWA), or a circuit card assembly (CCA). Electrical component 14 may be mechanically and electrically coupled to printed board 12. In different examples, a solder, an adhesive, such as an electrically and/or thermally conductive adhesive, or another mechanical fixation mechanism (e.g., a screw or bolt) can be used to mechanically or electrically connect electrical component 14 to printed board 12. In one example, electrical component 14 is attached to printed board 12 using a through-hole mounting technique where lead pins from electrical component 14 are inserted into through-holes from a first side of printed board 12 and then soldered from an opposite side of printed board 12. In another example, electrical component 14 is mounted to printed board 12 using surface mount technology (SMT) techniques where electrical component 14 is directly mounted on a conductive attach pad of printed board 12. Electrical component 14 can be attached to printed board 12 using any suitable techniques, as will be appreciated by those of skill in the art.

Printed board 12 may include a variety of different features for electrically or mechanically connecting to electrical component 14. For example, printed board 12 may include one or more attach pads (not shown), e.g., solder attach pads or adhesive attach pads, for mechanically or electrically connecting to electrical component 14. Printed board 12 may also include one or more vias (not shown) extending at least partially through printed board 12 including, e.g., one or more vias extending at least partially through printed board 12 in the z-direction shown on FIG. 1. In some examples, such vias in printed board 12 may include one or more electrical vias for electrically connecting electrical component 14 to at least one electrically conductive trace in printed board 12.

Printed board 12 may be constructed of a variety of different materials including, for example, fiberglass, resin, and copper. In some examples, printed board 12 may include a plurality of layers of laminate material. One or more of the plurality of layers may include copper tracing etched into the laminate material to provide an electrically conductive pathway through printed board 12. The plurality of layers of laminate material may be stacked, pressed together, and cured to produce printed board 12.

Printed board 12 may be configured, in some examples, to transfer thermal energy away from electrical component 12. In such examples, printed board 12 include one or more vias to provide a thermal pathway from the bottom surface or other surface of electrical component 14 directly adjacent to printed board 12. Printed board 12 may include or be coupled to a heat sink and the bottom surface of electrical component 14 may be thermally connected to the heat sink through printed board 12. Therefore, although the disclosure generally describes thermal transfer energy transfer across top surface 22 of electrical component 14 to thermal bridge 20, printed board 12 may facilitate thermal transfer from a bottom surface of electrical component 14 in addition to, or in lieu of, such thermal transfer. In some examples, comparatively less heat may be transferred through printed board 12 than thermal bridge 20, e.g., based on the different thermal conductivies of the different materials used to fabricate printed board 12 and thermal bridge 20.

Electrical component 14 may be mounted on printed board 14. In some examples, electrical component 14 is enclosed within a package (e.g., a housing) which may, e.g., protect electrical component 14 from environmental contaminants and facilitate placement of electrical component 14 during the fabrication of assembly 10. A package for electrical component 14 may include package lid and a package base. The package lid and package base may combine to substantially enclose electrical component 14. In some examples, a seal ring is positioned between the package lid and package base to, e.g., improve the hermetic sealing of the package. In one example, a package may include a flip-chip package, such as a flip-chip that includes balled or bumped solder die surface. In another example, a package may be a multichip package configured to house multiple electrical components. In any event, although assembly 10 is described as including electrical component 14 mounted on printed board 12, it shall be understood that electrical component 14 may reside within a package and that the package containing electrical component 14 may be mounted to printed board 12.

Electrical component 14 may be any generally known discrete component or integrated circuit (IC) component. In some examples, assembly 10 can includes a plurality of electrical components (e.g., two, three, four or more) mounted on printed board 12. The plurality of electrical components can be separately mounted or mounted together, e.g., in a multichip package.

Electrical component 14 may generate thermal energy during operation, which may cause the temperature of electrical component 14 to increase during operation. To reduce the temperature of electrical component 14 during operation, assembly 10 is configured such that thermal energy is transferred away from electrical component 14. As noted above, in some example, to manage the thermal energy generated by electrical component 14 within assembly 10, thermal energy may be transferred from electrical component 14 via printed board 12 through the bottom surface of electrical component 12 and/or top surface 22 of electrical component 14.

Thermal management of some high power components can be more difficult than thermal management of comparatively lower power components, e.g., based on the relatively greater amount of thermal energy used by the high power components. In some examples, the features and techniques of the disclosure may be used with an assembly that includes one or more high power components to provide thermal transfer through one or more surface not directly adjacent to the printed board (e.g., topside thermal energy transfer) addition to, or in lieu of, thermal transfer by way of the printed board on which the electrical component is mounted (which may be referred to in this disclosure as bottom side thermal energy transfer). Examples of comparatively higher power components may include, but are not limited to, processors, such as, e.g., flip chip style processors, application specific integrated circuits (ASICs), and the like. It should be appreciated, however, that the preceding examples of components are intended to be illustrative only, and the assemblies and techniques of this disclosure are not limited to any particular type of electrical component or combination of electrical components.

As described above, thermal energy may be transferred through top surface 22 of electrical component 14 to thermal bridge 20. It may be useful to transfer thermal energy away from electrical component 14 and, in some cases, away from printed board 12, in order to decrease the operating temperature of electrical component 14. To transfer thermal energy from electrical component 14 via thermal bridge 20, thermal bridge 20 may be thermally connected to top surface 22 of electrical component 14 either directly or through one or more thermally conductive members, e.g., to allow for conductive transfer of thermal energy between electrical component 14 and thermal bridge 20.

For example, as illustrated in FIG. 2, assembly 10 is configured to transfer thermal energy from top surface 22 of electrical component 14 through thermal bridge 20 by way of TIM 16 and thermal connector 18. In some examples, thermal energy may transfer from top surface 22 of electrical component 14 in the z-direction as indicated by arrows 80 and 82. Thermal energy may conductively move through TIM 16 and enter the base 32 of thermal connector 18. From base 32, thermal energy may transfer in the z-direction through projections 24 of thermal connector 18. Upon reaching the junction where projections 24 are at least partially, and in the example of FIG. 2 fully, inserted into the vias of thermal bridge 20, thermal energy may then transfer into thermal bridge 20, as indicated by arrows 84. As shown in FIG. 2, the thermal pathway of the transferred thermal energy may transition from the z-direction pathway defined by projections 24 and the vias of thermal bridge 20 into the x-y plane of thermal bridge 20.

Thermal bridge 20 may be positioned over at least a portion of the top surface 22 of electrical component 14, and, in some examples, thermal bridge 20 may be disposed over the entire top surface 22 of electrical component 14. Although not shown in FIG. 1, in some examples, thermal bridge 20 may also be positioned over a sidewall (e.g., sidewall defined in the z-x or z-y planes of FIG. 1) of electrical component 14, in a manner that provides for thermal energy transfer through both top surface 22 and one or more side surfaces of electrical component 14. In any case, thermal energy transferred from electrical component 14 into thermal bridge 20 may subsequently dissipate within thermal bridge 20 as indicated by arrows 86. For example, thermal energy from electrical component 14 may be transferred to mounting member 28, which may function as a heat sink in assembly 10. In this manner, assembly 10 may provide thermal energy transfer away for electrical component 14 through top surface 22 using thermal bridge 20, which may, in some examples, improve the operational performance of electrical component 14.

In some examples, thermal bridge 20 may be mechanically and/or thermally connected to printed board 20. For example, thermal bridge 20 may connect to printed board 12 and may surround at least a portion of electrical component 14 (e.g., straddle electrical component 14). Conversely, in other examples, thermal bridge 20 may not connect to printed board 12 but may instead span over electrical component 14. For example, in assembly 10, thermal bridge 20 spans over electrical component 14 and connects to mounting member 28.

In accordance with one or more examples of the disclosure, thermal bridge 20 includes vias 26. Vias 26 of thermal bridge 20 may provide for an increase in the rate of thermal energy transfer into thermal bridge 20 from electrical connector 14, e.g., as compared to an example in which thermal bridge 20 includes a substantially planar surface opposing top surface 22 of electrical component 14.

In assembly 10, each of vias 26 defines an aperture that extends through thermal bridge 20 in approximately the z-direction. The opening of each via 26 defines a face that is substantially orthogonal to the z-direction and substantially parallel to the surface plane of top surface 22 of electrical component 14. Thermal energy may be transferred in the z-direction across the plane defined by the bottom surface of thermal bridge 20 by projections 24 of electrical connector 18 located within vias 26. Thermal energy may further be transferred, at least in part, from projections 24 of electrical connector 18 into thermal bridge 20 through the sidewalls of vias 26. In such a configuration, thermal transfer pathways from electrical connector 18 to thermal bridge 20 may be defined in the x and y-directions across the interface of projections 24 and vias 26, e.g., rather than across the bottom surface of thermal bridge 20 in the z-direction as would be the case if thermal bridge 20 did not include vias 26. The thermal energy that enters thermal bridge 20 through the sidewalls of vias 26 may then dissipate across thermal bridge 20 in approximately the x-y plane. In this manner, a greater amount of thermal energy may be transferred into thermal bridge 20 compared to an example in which thermal bridge 20 includes a solid surface rather than including one or more vias 26.

Vias 26 of thermal bridge 20 may have any suitable size and shape. As shown for assembly 10, one or more of vias 26 may be configured (e.g., sized and/or shaped) to receive one or more of projections 24 of thermal connector 18. Accordingly, vias 26 of thermal bridge 20 may be dimensioned and shaped to receive projections 24 of thermal connector 18 including, e.g., the different dimensions and shapes discussed below with respect to FIGS. 3A-3F. In different examples, vias 26 may define a circular, elliptical, rectangular, square, or other arcuate or polygonal shape in the x-y cross-sectional plane. In examples where thermal bridge 20 includes a plurality of vias 26, each of vias 26 may be the same size and shape, or at least one via of the plurality of vias 26 may have a different size and/or shape from at least one other via of the plurality of vias 26. In some examples, the sidewalls of vias 26 may be substantially orthogonal to the bottom surface plane of thermal bridge 20 and/or top surface 22 of electrical component 14. In other examples, the sidewalls of vias 26 may be non-orthogonal (e.g., on a diagonal) to the bottom surface plane of thermal bridge 20 and/or top surface 22 of electrical component 14.

Moreover, while vias 26 are shown in FIGS. 1 and 2 as extending all the way through thermal bridge 20, in some example vias 26 may not extend all the way through thermal bridge 20 from the bottom surface but instead may only extend partially into thermal bridge 20 in the z-direction. In such an example, vias 26 may form indents into the bottom surface of thermal bridge 20, e.g., that may receive mated projections 24 for thermal energy transfer in the z-direction as described in the disclosure.

In any event, it is appreciated that the assemblies of the disclosure are not limited to a thermal bridge with a particular number, size, or shape of vias 26. Moreover, it is contemplated that assembly 10 may not include thermal connector 18 in all examples and vias 26 need not be configured to receive projections 24 of thermal connector 18.

Thermal bridge 20 may include a plurality of vias (e.g., two, three, four, or more) instead of a single via, although examples including a single via in thermal connector 20 are contemplated. For example, assembly 10 is shown in FIG. 1 to include twenty-five vias, although a different number of vias may be formed in thermal bridge 20. Increasing the number of vias 26 in thermal bridge 20 (e.g., relative to a single via 26) may increase the cross-sectional surface area in the x-z and y-z planes of thermal bridge 20 available for transferring heat away from electrical component 14. As such, thermal energy may be transferred from electrical component 14 at a greater rate compared to a thermal bridge with comparatively fewer thermal vias.

In some examples, vias 26 of thermal bridge 20 may be positioned directly over top surface 22, or a portion of top surface 22, of electrical component 14. In other examples, vias 26 of thermal bridge 20 may be offset (e.g., positioned off to a side) from top surface 22 of electrical component 14. Likewise, in examples where thermal bridge 20 includes a plurality of vias 26, the plurality of vias 26 may be may positioned directly over top surface 22, or a portion of top surface 22, of electrical component 14, or vias 26 may be offset relative to top surface 22 of electrical component 14. A combination of locations is also contemplated. Vias 26 may define an ordered arrangement including, e.g., an arrangement of rows and columns illustrated in FIG. 1. Alternatively, vias 26 may be arranged in a seemingly random pattern.

Vias 26 may be formed in thermal bridge 20 using a variety of techniques. For example, vias 26 can be cut or punched into thermal bridge 20. Alternatively, vias 26 can be defined during the fabrication of thermal bridge 20, e.g., by casting or otherwise forming thermal bridge 20 to include the at least one via 26. In some examples, it may be desirable to attach (e.g., using solder, a thermally conductive adhesive such as a thermally conductive epoxy, or the like) projections 24 of thermal connector 18 to vias 26 of thermal bridge 20. In additional examples, it may be desirable to mechanically reinforce vias 26. In either example, thermal bridge 20 may be plated along the perimeter defined by vias 26. In this regard, any of vias 26 with plating along a perimeter may be considered a plated via. Vias 26 may be plated with any suitable thermally conductive material including, e.g., but not limited to, copper, nickel plated copper and solder plated copper. In examples where thermal bridge 20 includes a plurality of vias 26, each via of the plurality of vias 26 may be plated, none of the vias of the plurality of vias 26 may be plated, or at least one via of the plurality of vias 26 may be plated while at least one other via of the plurality of vias 26 is unplated.

In the example of FIGS. 1 and 2, thermal bridge 20 is illustrated as defining a substantially flat surface and having substantially rectangular shape along the plane orthogonal to the z-direction. Thermal energy transferred into thermal bridge 20 from electrical connector may be dissipated within thermal bridge along a plane substantially orthogonal to the z-direction. However, to reach thermal bridge 20, energy transferred out of electrical component 14 may be transferred in the z-direction through TIM 16 and electrical connector 18.

Vias 26 in thermal bridge 20 may accommodate a directional shift between a thermal pathway defined by TIM 16 and thermal connector 18 in the z-direction, and a thermal pathway defined by thermal bridge 20 in the plane substantially orthogonal to the z-direction. For example, as described previously, vias 26 of thermal bridge 20 may provide surface area that is substantially parallel to the z-direction for thermal transfer, which may increase thermal energy transfer rates away from electrical component 14 relative to a thermal bridge without at least one via 26. For example, thermal energy may transfer in the z-direction within projections 24 of electrical connector and then transfer through the sidewalls of vias 26 into to thermal bridge 20, whereupon the thermal energy may dissipate across the x-y plane of thermal bridge 20. Conversely, without vias 26, thermal energy may be transferred to a bottom surface of thermal bridge 20, which may necessitate thermal diffusion in the z-direction of thermal bridge 20 as well in the x- and y-directions of thermal bridge 20. Accordingly, thermal transfer away from electrical component 14 by way of thermal bridge 20 may be comparatively slower than examples such as assembly 10 where thermal bridge 20 includes vias 26.

Thermal bridge may have any suitable shape. In the example of assembly 10, thermal bridge has a substantially flat, rectangular shape. However, thermal bridge 20 may assume different shapes than that shown in FIGS. 1 and 2. The different shapes may be dictated by the shape of electrical component 14, the shape of thermal connector 18, or different considerations including, e.g., the shape of an electrical device in which assembly 10 may be incorporated. Thermal bridge 20 may assume any general arcuate (e.g., curved, rounded, circular, cylindrical) or polygonal (e.g., square, rectangular, trapezoidal, hexagonal) three dimensional shape provided that the shape of thermal bridge 20 allows thermal bridge 20 to be thermally connected to top surface 22 of electrical component 14 and transfer thermal energy out of electrical component 14.

In some examples, thermal bridge 20 may be formed of any suitable thermally conductive material. Thermal bridge 20 may exhibit thermal conductivities to allow for suitable transfer and dissipation of thermal energy received from electrical component 14. Examples materials may have a thermal conductivity of at least 160 Watts per meter Kelvin (W/m*K), such as e.g., at least 400 Watts per meter Kelvin. In different examples thermal bridge 20 may be formed from a thermally isotropic material or a thermally orthotropic material. A thermally orthotropic material may include a material that is arranged during the fabrication of thermal bridge 20 to exhibit thermally orthotropic properties. In general, a thermally orthotropic material exhibits a thermal conductivity in one direction that is different from a thermal conductivity in at least one other direction. By contrast, a thermally isotropic material generally exhibits substantially equal thermal conductivities in every direction. Because some thermally orthotropic materials exhibit thermal conductivities in at least one direction that are greater than the thermal conductivities exhibited by standard isotropic materials, employing a thermally orthotropic material in thermal bridge 20 may, in some examples, increase heat transfer rates away from electrical component 14 relative to using a thermal bridge fabricated from a thermally isotropic material. Examples of isotropic materials that may be used to fabricate thermal bridge 20 include, but are not limited to, copper, aluminum, beryllium and alloys thereof. Examples of orthotropic materials that may be used to fabricate thermal bridge 20 include, but are not limited to, oriented carbon fibers such as, e.g., oriented graphite fibers and oriented carbon fibers with a granular microstructure. It should be appreciated, however, that the foregoing isotropic and orthotropic materials are only examples, and the assemblies of the disclosure are not limited to a thermal bridge fabricated from any particular material.

In some examples, when thermal bridge 20 is formed of a thermally orthotropic material, thermal bridge may exhibit a thermal conductivity in one or more directions that is different from a thermal conductivity in at least one other direction. For example, thermal bridge 20 may be formed of a thermally orthotropic material to exhibit a thermal conductivity in the x-direction and/or y-direction (or generally in the x-y plane) that is greater than the thermal conductivity in the z-direction. In such an example, while the thermally orthotropic nature of thermal bridge 20 may provide desirable dissipation of thermal energy in the x-y plane, the transfer of such thermal energy in the z-direction within thermal bridge 20 may limit the overall transfer of thermal energy out of electrical component 22. Accordingly, vias 26 in thermal bridge 20 may provide for thermal energy transfer into thermal bridge 20 in the z-direction, e.g., within projections 24, followed by the transfer of the thermal energy into thermal bridge 20 through vias 26 along the x-y plane. In this manner, vias 26 may improve thermal energy transfer away from electrical component 14 into thermal bridge 20 when thermal bridge 20 formed of a thermally orthotropic material as compared to a similar configuration in which thermal energy is transferred from electrical component 14 through the bottom surface of thermal bridge 20 without any vias 26. As noted, increased transfer of thermal energy from electrical component 14 during operation may, e.g., improve the performance of electrical component 14, e.g., by lowering the operating temperature of electrical component 14.

As describe above, in the example of FIGS. 1 and 2, thermal bridge 20 is thermally coupled to electrical component 14 via TIM 16 and thermal connector 18. Thermal energy transferred from electrical component 14 to thermal bridge 20 is primarily transferred through top surface 22. In combination, TIM 16 and thermal connector 18 provide one or more conductive pathways from top surface 22 to thermal bridge 20 to allow heat to transfer away from electrical component 14 through TIM 16 and thermal connector 18 into thermal bridge 20. In different examples, however, assembly 10 may include a single thermally conductive member (e.g., TIM 16 or thermal connector 18 alone), or assembly 10 include additional or different thermally conductive members. For example, as will be described below with regard to FIGS. 4 and 5, an assembly 100 includes first TIM 16, second TIM 104, and heat spreader 102 between top surface 22 of electrical component 14 and thermal bridge 20.

In the example assembly 10, TIM 16 provides a thermally conductive pathway from electrical component 14 to thermal connector 18. As such, TIM 16 is placed on at least a portion of the top surface 22 of electrical component 14. In some examples, TIM 16 is disposed directly adjacent top surface 22 of electrical component 14. In other examples, TIM 16 is placed over one or more additional layers which may include, e.g., one or more additional thermally conductive members and/or one or more additional TIM materials or TIM layers, one of which is in turn disposed directly adjacent top surface 22 of electrical component 14. In additional examples, TIM 16 may be placed over substantially the entire top surface 22 of electrical component 14 instead of only a portion of top surface 22. In other words, TIM 16 may be placed over substantially the entire top surface 22 of electrical component 14 or over a lesser portion of top surface 22 of electrical component 14.

While TIM 16 can comprise any suitable thermally conductive material, in general, higher thermal conductivity materials increase heat transfer rates away from electrical component 14. In some examples, TIM 16 may include, but is not limited to, thermally enhanced epoxies, gels, greases, putties, and compressible pads. In some examples, the foregoing materials may fall within a class of materials called TIM-1 materials. Therefore, TIM 16 may, in some examples, be considered to include all TIM-1 materials. It should be appreciated, however, that other thermal interface materials are contemplated as being suitable for assembly 10. Indeed, some thermal interface materials may provide properties in addition to thermal transfer. For example, TIM 16 may adhesively attach thermal connector 18 to electrical component 14 in addition to providing thermal transfer between electrical component 14 and thermal connector 18.

TIM 16 in the example of FIG. 1 defines thickness 30, which is a thickness in the z-direction shown in FIG. 1 that is substantially orthogonal to top surface 22 of electrical component 14. In general, thermal energy may transfer away from top surface 22 of electrical component 14 regardless of the specific thickness 30 of TIM 16. However, in some examples, the thermal conductivity of thermal connector 18, thermal bridge 20, and/or an additional or different thermally conductive member interposed between top surface 22 and thermal bridge 20 may be comparatively higher than the thermal conductivity of TIM 16. Higher thermal conductivity materials may promote higher energy transfer rates away from electrical component 14. As such, minimizing the thickness of TIM 16 may, in some examples, improve heat transfer away from electrical component 14. In some examples, thickness 30 of TIM 16 may be less than or equal to approximately 1 mil (i.e., 0.001 inch). In additional examples, thickness 30 of TIM 16 may be less or equal to approximately 5 mils (i.e., 0.005 inch). For example, thickness 30 of TIM 16 may be between approximately 1 mil and approximately 5 mil including, e.g., between approximately 2 mil and approximately 4 mil. It should be appreciated that assembly 10 is not limited in this regard though, and different thicknesses 30 of TIM 16 may be used.

TIM 16 is thermally connected to thermal connector 18. Thermal connector 18 provides a thermal pathway between electrical component 14 and, in particular TIM 16, and thermal bridge 20. As described above, thermal connector 18 may have a comparatively higher thermal conductivity than TIM 16. Therefore, although thermal connector 18 may be omitted from assembly 10 as describe below with respect to FIG. 4, the inclusion of thermal connector 18 in assembly 10 may provide increased heat transfer rates away from electrical component 14 relative to an assembly that does not include thermal connector 18.

In general, thermal connector 18 is configured to conductively transfer heat between top surface 22 of electrical component 14 and thermal bridge 20. As such, in some examples, thermal connector 18 includes at least one projection 24 extending between electrical component 14 and thermal bridge 20 (e.g., in the z-direction illustrated on FIG. 1). Projections 24 may be configured to extend into at least one via 26 of thermal bridge 20. In some examples, projections 24 may be attached, e.g., using solder, a thermally conductive adhesive, or the like, to vias 26. When inserted into vias 26, projections 26 may extend at least partially, and in some case fully, through vias 26 of thermal bridge 20. When extended within vias 26, projections 24 may thermally connect with thermal bridge 20, e.g., to provide for conductive thermal energy transfer from projections 24 to thermal bridge through the side walls of vias 26. In this manner, thermal connector 18 can provide a thermal pathway between electrical component 14 and thermal bridge 20.

In some examples, thermal connector 18 may include a plurality of projections (e.g., two, three, four, or more) instead of a single projection. For example, assembly 10 in FIG. 1 includes twenty-five individual projections 24 extending from base 32, although a different number of projections 24 can be included on thermal connector 18. As shown, thermal connector 18 may include a number of projections 24 that is equivalent to a number of corresponding vias 26 of thermal bridge 20. As described above, each projection 24 may facilitate thermal transfer in the z-direction away from electrical component 14 while thermal bridge 20 may facilitate thermal transfer in the x-y plane. In this way, thermal connector 20 may transfer heat away from electrical component 14 in one direction while thermal bridge 20 may dissipate the heat drawn away by thermal connector 18 in at least one, and in some cases two or more, directions different from to the direction heat is drawn away by thermal connector 18. As such, increasing the number of projections 24 of thermal connector 18 may increase the number of pathways that can facilitate heat transfer in the z-direction for subsequent transfer into the x-y plane of thermal bridge 20. In other examples, the number of projections 24 on thermal connector 18 may be different than the number of vias 26 of thermal bridge 20. For example, thermal connector 18 may include a number of projections that is less than that of the number of vias 26 of thermal bridge 20.

Projections 24 of thermal connector 18 may define any suitable size and cross-sectional shape for transferring thermal energy from electrical component 14 to thermal bridge 20. In some examples, projections 24 include a plurality of substantially uniformly sized and shaped projections. In different examples, projections 24 includes a plurality of projections and at least one projection of the plurality projections has a size and/or shape different than at least one other projection of the plurality of projections. Various example configurations for thermal connector 18 are discussed in greater detail below with respect to FIGS. 3A-3F.

Thermal connector 18 may be formed from one or more thermally conductive materials. Examples of suitable materials for thermal connector 18 include, but are not limited to, copper, a copper alloy, tin plated copper, and nickel plated copper.

As describe above, in some examples, assembly 10 may include a thermal bridge 20 fabricated from a thermally orthotropic material. Additionally or alternatively, TIM 16 and thermal connector 18 may be formed from thermally isotropic materials. Thermally isotropic materials, as noted above, generally exhibit substantially equal thermal conductivities in every direction. Because one or more thermally conductive members may provide thermal transfer in the z-direction away from electrical component 14 as well as thermal transfer in the x- and y-directions into thermal bridge 20 at vias 26, thermally conductive members fabricated from thermally isotropic materials may facilitate increased multidirectional thermal transfer for removing heat from electrical component 14. Alternatively, TIM 16 and/or electrical connector 18 may be formed of thermally orthotropic material, e.g., to exhibit increased thermal conductivity in the z-direction.

While assembly 10 includes TIM 16 and electrical connector 18 are thermally conductive member located between top surface 22 of electrical component 14 and thermal bridge 20, examples are not limited as such. In some examples, as described with respect to FIGS. 4 and 5, an assembly may include a thermal interface material (TIM), such as, TIM 16 without thermal connector 18, to conductively transferred thermal energy away from electrical component 14 thermal bridge 20. In other words, thermal energy may be transferred away from top surface 22 of electrical component 14 without thermal connector 18 shown in FIGS. 1 and 2. In other examples, an example assembly may include thermal connector 18 without TIM 16. Thermal energy may be transferred away from top surface 22 of electrical component 14 through a thermal pathway defined by thermal connector 18 and thermal bridge 20. In other words, thermal energy may be transferred away from top surface 22 of electrical component 14 without TIM 16. In additional examples, as shown in FIG. 1, an assembly may include a plurality (e.g., two, three, four, or more) of thermally conductive members for transferring heat away from electrical component 14 to thermal bridge 20 at least in part through vias 26. For example, as described above, assembly 10 is illustrated in FIG. 1 as having two thermally conductive members in the form of TIM 16 and thermal connector 18. Additional thermally conductive members are contemplated, and some additional examples are described below.

Although assembly 10 is illustrated and described as a standalone assembly, in some examples, assembly 10 may be incorporated into a larger assembly or device. Accordingly, assembly 10 may include electrical and/or mechanical connections to facilitate incorporation into a larger assembly or device. Assembly 10 in the example of FIG. 1, for instance, includes mounting member 28, which may be used to mechanically mount assembly 10 in a larger assembly. Mounting member 28 may be inserted into a corresponding structure, such as a chassis rail, to mechanically connect assembly 10. In different examples, assembly 10 may include multiple mounting members or a mounting member with a different size or shape than mounting member 28 illustrated in FIG. 1. Indeed, mounting members are not required by assemblies according to this disclosure. Therefore, although assembly 10 includes a single mounting member 28 configured for chassis rail attachment, is shall be understood that the disclosure is not limited in this regard.

In addition to providing mechanical connectivity for assembly 10, in some examples, mounting member 28 may function as a heat sink for assembly 10. In this regard, mounting member 28 may be fabricated from a thermally conductive material. During operation of electrical component 14, mounting member 28 may absorb thermal energy from thermal bridge 20, which in turn may absorb thermal energy from electrical component 14, e.g., by way of those example configurations described in this disclosure. In this way, mounting member 28 may serve as a destination for thermal energy removed from electrical component 14. Mounting member 28 may dissipate the heat absorbed from electrical component 14, e.g., through conductive transfer to another element or another medium, such as air or a cooling fluid.

In addition to, or in lieu of, mounting member 28, assembly 10 may include a dedicated heat sink for absorbing thermal energy from thermal bridge 20. The heat sink may be thermally connected to thermal bridge 20. In addition, the heat sink may be arranged in various locations on assembly 10 including, e.g., adjacent thermal bridge 20. However, a dedicated heat sink is not required by assembly 10.

As configured, in general, assembly 10 may provide a first thermal conduction pathway in a first axial direction (e.g., z-direction) and a second thermal pathway (e.g., in the x-y plane) in a second axial direction substantially orthogonal to the first axial direction. Assembly 10 may provide additional or different thermal conduction pathways based on a variety of factors including, e.g., the geometry of thermal bridge 20 and the geometry, number, and arrangement of the one or more thermally conductive members used in assembly 10. Accordingly, it is appreciated that the description of thermal pathways are only examples, and the assemblies of the disclosure are not limited to any particular configuration of thermal conduction pathways. Moreover, it should be appreciated that although the description of thermal pathways identified thermal energy as moving in discrete, uniform directions, in practice, thermal energy may diffuse across all directions of a thermally conductive element. That is, although a thermally conductive element may preferentially conduct thermal energy in some directions over other directions, e.g., based on the physical orientation of the element or the nature of the material used to fabricate the element, thermal energy may, in fact, move through all directions and surfaces of a thermally conductive element.

As described above, thermal bridge 20 is configured to thermally connect to one or more thermally conductive members to transfer heat away from electrical component 14. In some examples, thermal bridge 20 transfers thermal energy out-of-plane with the one or more thermally conductive members. In other words, although a thermally conductive element may conduct thermal energy in all directions to some extent, an element may preferentially conduct thermal energy in some directions over other directions, e.g., based on the physical orientation of the element or the nature of the material used to fabricate the element. In assembly 10, for example, thermal energy may transfer heat away from electrical component 14 through TIM 16 and thermal connector 18 in the z-direction based on the physical orientation of TIM 16 and thermal connector 18. On the other hand, thermal energy may transfer through the x- and y-directions in thermal bridge 20. Accordingly, thermal bridge 20 may include one or more features to accommodate a directional shift between a thermal pathway defined by one or more thermally conductive members and a thermal pathway defined by thermal bridge 20.

As described above, assembly 10 may be configured to facilitate thermal transfer from a sidewall (e.g., a sidewall of electrical component 14 defined in the z-x or z-y planes of FIG. 2), bottom surface, or different surface of electrical component 14 in additional to, or in lieu of, topside thermal transfer. For example, arrow 82 in FIG. 2 indicates that thermal energy may transfer from a bottom surface of electrical component 14 during the operation of electrical component 14. Thermal energy may transfer from electrical component 14 into printed board 12 (e.g., either into printed board 12 directly or into a thermally conductive features such as a trace or via that forms part of printed board 12), whereupon the thermal energy can transfer away from electrical component 14 and dissipate.

Therefore, according to the example of FIG. 2, assembly 10 may be configured to provide multiple different thermal pathways for conductively transferring heat away from electrical component 14. Assembly 10 may provide a topside thermal transfer pathway and a bottom-side thermal transfer pathway. In some examples, the topside thermal transfer pathway may be transfer more thermal energy away from electrical component 14 than the bottom-side thermal transfer pathway, e.g., based on the materials and arrangement of features selected for the topside thermal transfer pathway as opposed to the materials and features used to mechanically and electrically coupled electrical component 14 to printed board 12.

Figure 3A:
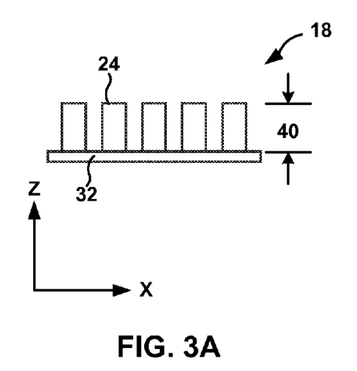
FIG. 3A-3F are conceptual side and top views of example thermally conductive members that may be used in the example assembly of FIG. 1.
Figure 3B:
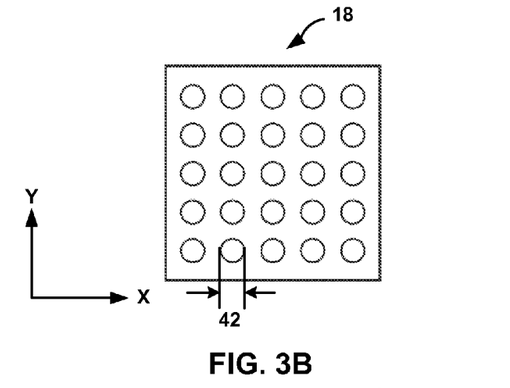

FIGS. 3A-3F are conceptual side and top views of different example thermal connectors, such as, e.g., thermal connector 20, that may be used in assembly 10 of FIGS. 1 and 2. FIG. 3A illustrates a conceptual side view of thermal connector 18 shown in FIG. 1. FIG. 3B illustrates a conceptual top view of the same thermal connector 18. As seen in FIGS. 3A and 3B, thermal connector 18 includes projections 24, which in the case of FIGS. 3A and 3B are shown as totaling twenty-five projections. Each individual projection 24 defines a substantially circular cross-section shape in the x-y plane. In addition, each of projections 24 has a substantially uniform height 40 in the z-direction. In different examples, height 40 of each projection 24 may be the same, or at least one projection of the plurality projections 24 may have a height 40 different than the height 40 of at least one other projection of the plurality of projections 24.

Height 40 may vary based on a variety of factors including, e.g., the geometry of electrical component 14 and thermal bridge 20, the number of thermally conductive members employed in an assembly, and the distance between top surface 22 of electrical component 14 and thermal bridge 20. In some examples, height 40 may be set such that projections 24 extend at least partially, and in some examples fully, through a plurality of vias 26 of thermal bridge 20. Extending projections 24 at least partially into the plurality of vias 26 may, in some examples, establish physical contact between thermal connector 18 and thermal bridge 20 to increase the rate of thermal transfer (e.g., as compared to examples in which a thermal bridge does not include one or more vias 26 (FIG. 1), and/or assist with placement of thermal bridge 20 over thermal connector 18 during fabrication of assembly 10. In different examples height 40 may be between approximately 0.1 inches and approximately 0.3 inches. Other heights 40 are contemplated however.

As described, each of projections 24 defines a substantially circular cross-section shape in the x-y plane indicated in FIG. 1, and may be considered to define a substantially cylindrical peg extending out of the base of thermal connector 18. In different examples, each of projections 24 may define a different cross-sectional shape. For example, each of projections 24 may define a polygonal cross-sectional shape such as a square, rectangular, triangular, or hexagonal shape, or each of projections 24 may define a generally arcuate cross-sectional shape such as a circle, half-circle, or ellipse. In general, the at least one projection 24 may define any cross-sectional shape.

Each of projections 24 may define any suitable major axis dimension 42 in the x-y plane. In some examples, each of projections 24 may define a major axis dimension 42 between approximately 0.05 inches and approximately 2.5 inches, such as, e.g., between approximately 0.75 inches and approximately 0.9 inches. It should be understood, however, that these dimensions are only examples, and the disclosure is not limited in this regard. Further, although projections 24 may define an ordered arrangement including, but not limited to, an arrangement of rows and columns illustrated in FIG. 3B, projections 24 need not be ordered. In different examples, projections 24 may, e.g., be arranged in a seemingly random order.

In the example of FIGS. 3A-3B, thermal connector 18 includes base 32 from which projections 24 extend. In various examples, base 32 is configured to be placed over at least a portion of top surface 22 of electrical component 14 including, e.g., over the entire top surface 22 of electrical component 14. Base 32 may provide mechanical support for connecting and supporting projections 24. Base 32 may also provide thermal connectivity for thermally connecting projections 24. In various examples, base 32 may be flat (as in FIGS. 3A-2B), curved, or base 32 may assume a different shape. For example, base 32 may surround at least a portion of a sidewall (e.g., a sidewall defined in the z-x or z-y planes of FIG. 1) of electrical component 14, thereby providing thermal transfer from both top surface 22 and a side surface of electrical component 14. In any event, thermal connector 18 does not require base 32, and different thermal connectors without base 32 are within the scope of the disclosure.

Figure 3C:
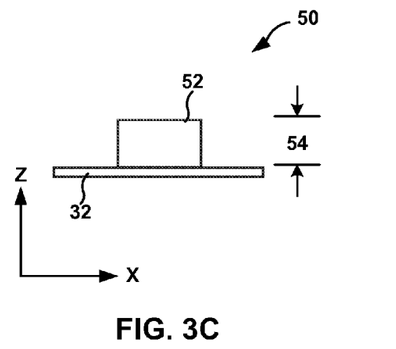
Figure 3D:
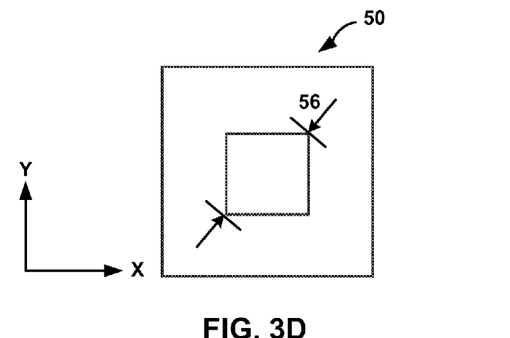

FIGS. 3C and 3D are conceptual diagrams illustrating an alternative example thermal connector 50. In particular, FIG. 3C illustrates a conceptual side view of thermal connector 50, and FIG. 3D illustrates a conceptual top view of thermal connector 55. As seen in FIGS. 3C and 3D, thermal connector 50 defines a single projection 52 with a substantially square cross-sectional shape in the x-y plane which extends out of base 32. In different examples, single projection 52 may define a different cross-sectional shape, e.g., as described with respect to FIGS. 3A-3B. Single projection 52 defines a height 54 (i.e., in the z-direction) and a major axis dimension 56 (i.e., in the x-y plane). In various examples, height 54 and major axis dimension 56 may be the same as height 40 and major axis dimension 42 in FIGS. 3A and 3B, respectively, or height 54 and major axis dimension 56 may be different than height 40 and major axis dimension 42.

Figure 3E:
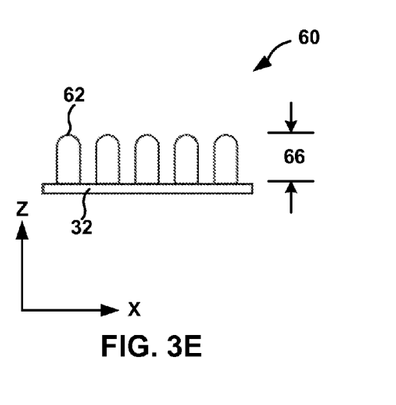
Figure 3F:
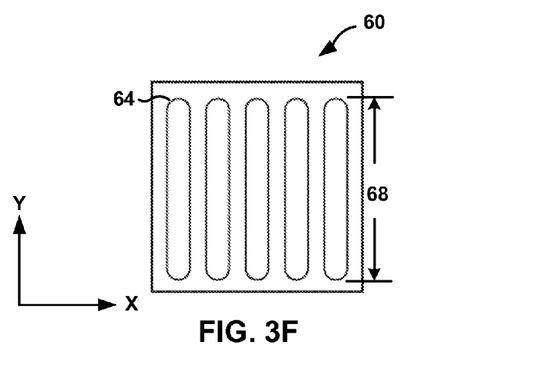

FIGS. 3E and 3F are conceptual diagrams illustrating another alternative example thermal connector 60. FIG. 3E is a conceptual side view of thermal connector 60. FIG. 3D is a conceptual top view of thermal connector 60. As seen in FIGS. 3E and 3F, thermal connector 60 defines a single row of projections 62 having an elongated shape extending out of base 32. Each elongated projection 62 defines a substantially rectangular cross-sectional shape in the x-y plane, and the substantially rectangular shape is terminated with arcuate ends 64. In different examples, elongated projections 62 may define a different cross-sectional shape, e.g., as described with respect to FIGS. 3A and 3B. Further, each row of the plurality of rows 62 defines height 66 (i.e., in the z-direction) and major axis dimension 68 (i.e., in the x-y plane). In various examples, height 66 and major axis dimension 68 may be the same as height 40 and major axis dimension 42 in FIGS. 2A and 2B, respectively, or height 66 and major axis dimension 68 may be different than height 40 and major axis dimension 42. It should be appreciated, however, that the foregoing thermal connectors described with respect to FIGS. 3A-3F are only examples, and the assemblies of the disclosure do not required any particular thermal connector.

As described above with respect to FIGS. 1 and 2, example assemblies according to the disclosure may include one or more thermally conductive members interposed between surface of an electrical component and a thermal bridge including one or more vias. In the example of FIG. 1, TIM 16 and thermal connector 18 function as thermally conductive members of assembly 10 to transfer energy from electrical component 14 to thermal bridge 20 at least partially through vias 26.

Figure 4:
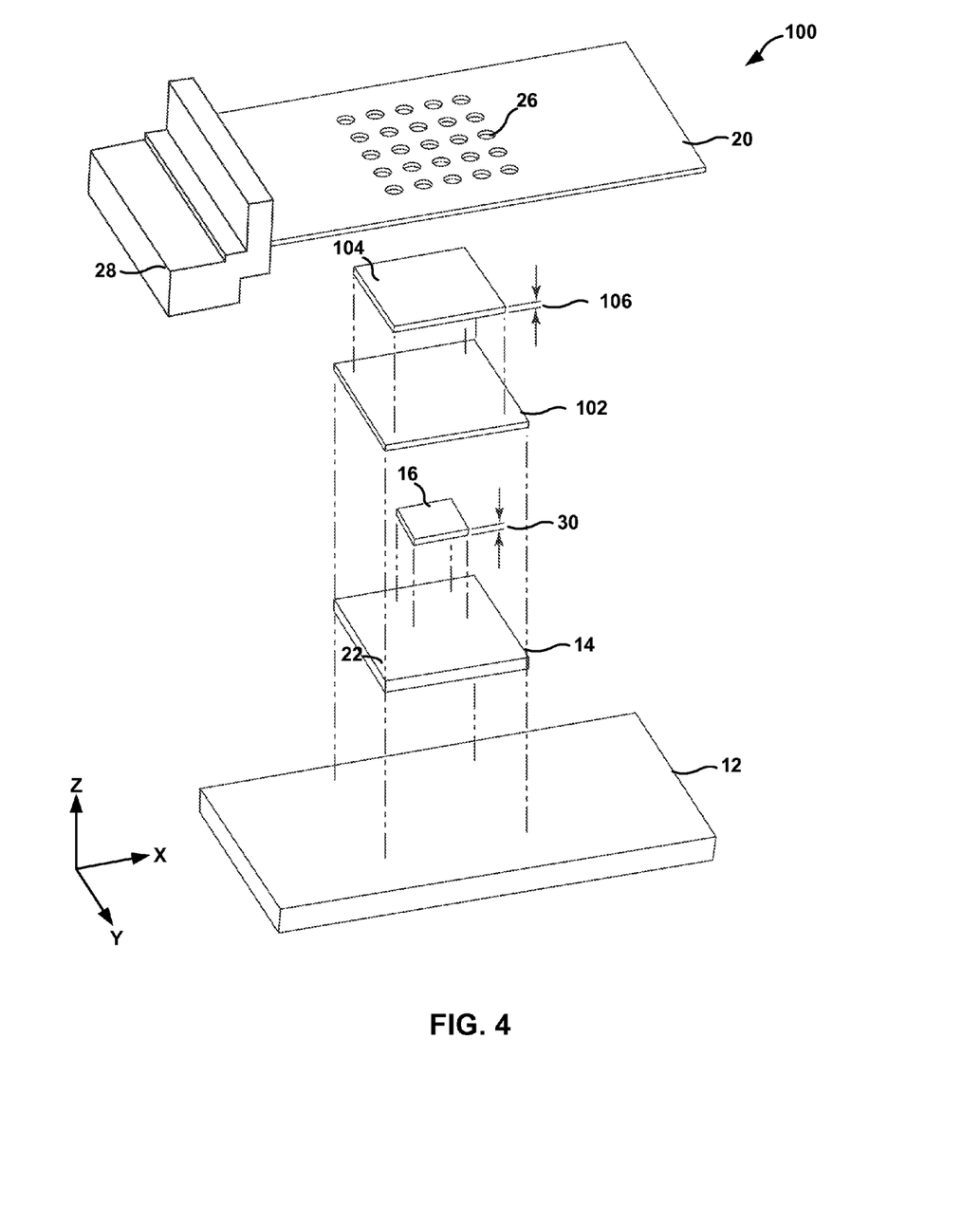
FIG. 4 is another conceptual diagram illustrating an exploded view of an example electrical component assembly that includes an electrical component, a thermal bridge, and one or more thermally conductive members.
Figure 5:
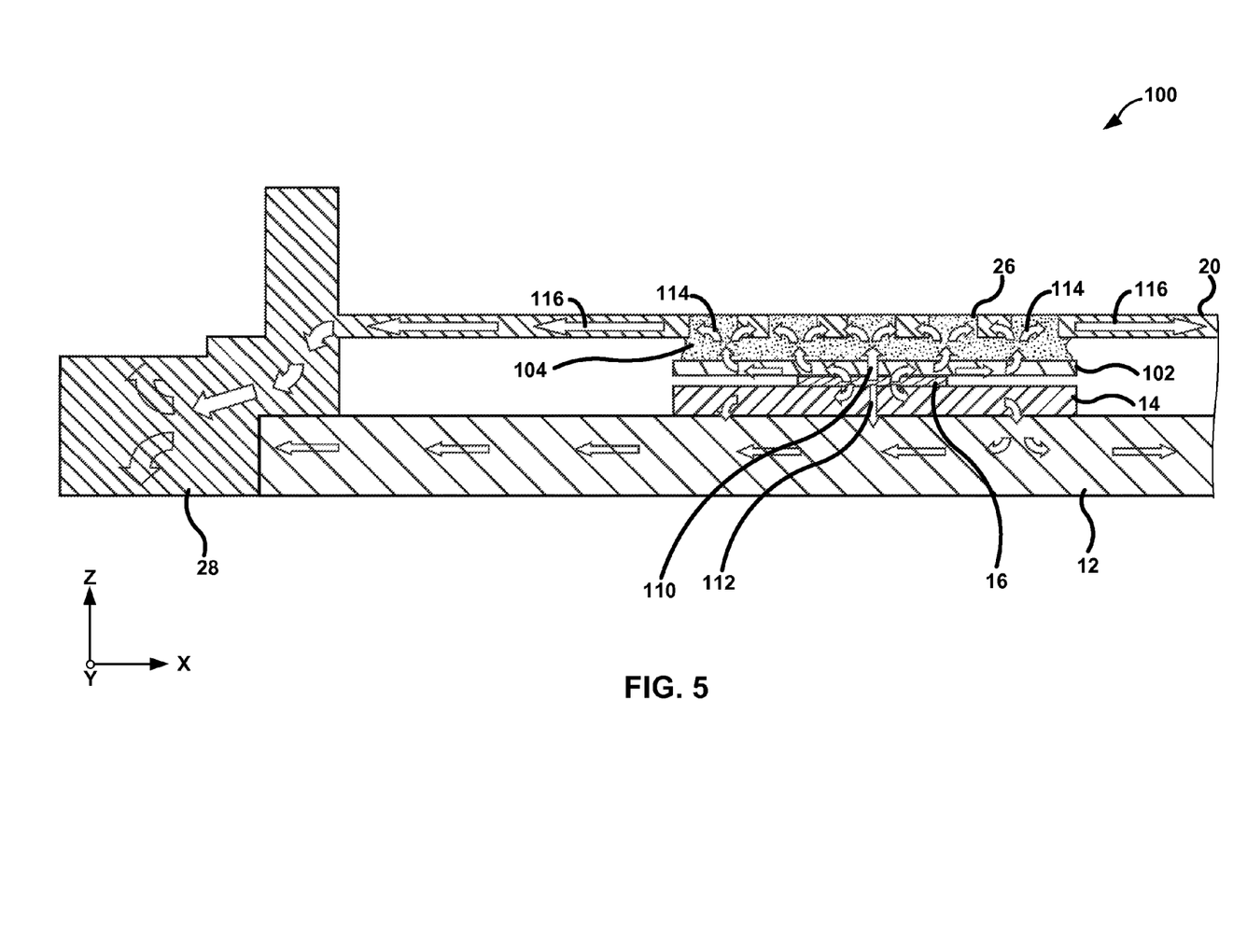
FIG. 5 is a schematic cross-sectional view of the example assembly of FIG. 4 showing example thermal transfer pathways.

FIG. 4 is conceptual diagram illustrating an exploded view of another example electrical component assembly 100. FIG. 5 is a schematic cross-sectional view of example assembly 100 in an assembled state showing example thermal transfer pathways within assembly 100. The view of assembly 100 in FIG. 5 is shown along a cross-section bisecting a row of vias 26 in the x-z plane.

As shown, assembly 100 includes printed board 12, electrical component 14, first TIM 16, thermal bridge 20, and mounting member 28, all of which may be the same or substantially similar to that of the similarly labeled features of assembly 10 (FIG. 1). Assembly 100 also includes heat spreader 102 and second thermal interface material (TIM) 104. First TIM 16 is interposed between top surface 22 of electrical component 14 and heat spreader 102, while second TIM 104 is interposed between heat spreader 102 and thermal bridge 20.

Thermal bridge 20 includes a plurality of vias 26, which in the example of FIG. 4, as in the example of FIG. 1, is shown as a plurality of vias 26. For ease of illustration, only a single via 26 is labeled in FIG. 4, although the plurality of vias 26 of thermal bridge 20 may be collectively referred to herein in some instances as "vias 26". Vias 26 extend through thermal bridge 20 in the z-direction shown on FIG. 4 to define a plurality of apertures in thermal bridge 20. In some examples, second TIM 104 extends at least partially, and in some cases fully, through the plurality of vias 26 in thermal bridge 20.

Assembly 100 is configured to transfer heat away from top surface 22 of electrical component 14. When assembly 10 is assembled as shown in FIG. 4, the bottom surface of first TIM 16 may be in contact with top surface 22 of electrical component 14. Similarly, at least a portion of the top surface of first TIM 16 may be in contact with the opposing (bottom) surface of heat spreader 102. At least a portion of the top surface of heat spreader 102 may be in contact with the opposing (bottom) surface of second TIM 104. In this manner, thermal energy may be conducted out of electrical component 12 through top surface 22 into first TIM 16. From first TIM 16, the thermal energy may then be conducted into heat spreader 102 across the surface interface with TIM 16. From heat spreader 102, the thermal energy may then be conducted into second TIM 104 across the surface interface with heat spreader 102. From second TIM 104, the thermal energy then is transferred into thermal bridge 20, at least some of which is transferred through the side walls of vias 26. When assembled, at least a portion of second TIM 16 extends into vias 26 in thermal bridge 20. Vias 26 extend through thermal bridge 26 in approximately the z-direction (as labeled in FIGS. 1 and 2) to define a plurality of apertures in thermal bridge 20.

As such, assembly 100, as with assembly 10, includes one or more thermally conductive members interposed between top surface 22 of electrical component 14 and thermal bridge 20 to conduct thermal energy from electrical component 14 to thermal bridge 20. In particular, assembly 100 includes first TIM 16, heat spreader 102, and second TIM 104, in that order, between top surface 22 of electrical component 14 and thermal bridge 20. Similar to that of TIM 16 and electrical connector 18 of assembly 10, in combination, first TIM 16, heat spreader 102, and second TIM 104 provide one or more thermal pathways from top surface 22 to thermal bridge 20 to transfer thermal energy from electrical component 14 to thermal bridge 20. The different thermally conductive members described for assemblies 10 and 100 may each be used singly between electrical component 14 and thermal bridge 20, or any combination of the different thermally conductive members may be used together between electrical component 14 and thermal bridge 20.

For example, in some cases, assembly 100 may include first TIM 16 or second TIM 104, directly interposed between top surface 22 of electrical component 14 and thermal bridge 20 without additional thermally conductive members. In such examples, thermal energy may be conductively transferred away from electrical component 14 through a thermal pathway defined by first TIM 16 or second TIM 104 and thermal bridge 20. In other examples, assembly 100 may include heat spreader 102 directly interposed between top surface 22 of electrical component 14 and thermal bridge 20 without additional thermally conductive members. In such examples, thermal energy may be conductively transferred away from electrical component 14 through a thermal pathway defined by heat spreader 102 and thermal bridge 20. In additional examples, as shown in FIGS. 1 and 4, an assembly may include a plurality of thermally conductive members for transferring heat away from electrical component 14.

In any case, as assembly 100 is configured, thermal energy may be conductively transferred out of electrical component 14 to reduce the temperature of electrical component. For example, during operation of electrical component 14, thermal energy may be transferred out of electrical component across top surface 22 into thermal bridge 20 by way of first TIM 16, heat connector 102, and second TIM 104. As illustrated in FIG. 5, thermal energy may transfer out of top surface 22 of electrical component 14 in approximately the z-direction as indicated, e.g., by arrows 110 and 112 being conductively transferred through first TIM 16 into heat spreader 102. Heat spreader 102 may allow all or a portion of thermal energy to dissipate in one or more of the x-, y-, and z-directions. From heat spreader 102, thermal energy may conductively transfer in the z-direction through second TIM 104.

Such thermal energy may then be transferred from second TIM 104 to thermal bridge 20. For example, at least a portion of thermal energy is transferred to thermal bridge 20 at the interface where second TIM 104 at least partially, and in the example of FIG. 5 fully, extends into vias 26 of thermal bridge 20. As with assembly 10, thermal energy may be transferred in the z-direction within the portion of second TIM 14 in vias 26, and then transferred into thermal bridge through the side walls of vias 26, as indicated by arrows 114. In other words, thermal energy may transfer in the z-direction in the portion of second TIM 104 within vias 26 followed by the transfer of the thermal energy into thermal bridge 20 along a plane substantially orthogonal to the z-direction. In addition, thermal energy may be transferred from second TIM 104 to thermal bridge through the bottom surface of thermal bridge 20. The thermal energy transferred to thermal bridge 20 may subsequently dissipate across thermal bridge 20 as indicated by arrows 116. For example, thermal energy from electrical component 14 may be transferred to mounting member 28, which may function as a heat sink in assembly 10. In this manner, assembly 10 may provide thermal energy transfer away for electrical component 14 through top surface 22 using thermal bridge 20, which may, in some examples, improve the operational performance of electrical component 14.

Similar to that of assembly 10, assembly 100 is configured such that thermal energy is conducted in the z-direction within vias 26. This thermal energy may then be transferred into thermal bridge 20 at various locations along the thickness (z-direction dimension) of thermal bridge 20, e.g., as opposed to substantially all of the thermal energy being conducted into a thermal bridge 20 at a single location in the z-direction defined by the bottom surface of thermal bridge 20 (the surface opposing top surface 22 of electrical component 14). Such a configuration may increase the rate of thermal energy transfer into thermal bridge 20, e.g., as compared to an example in which thermal bridge 20 does not include vias 26 but instead defines a substantially planar bottom surface.

Unlike that of assembly 10, assembly 100 includes heat spreader 102 interposed between TIM 16 and TIM 104. Heat spreader 102 may function to conductively dissipate thermal energy, e.g., in the x-y plane, from electrical component 14, which in turn may increase thermal energy transfer away from electrical component 14. Accordingly, heat spreader 102 may be placed over at least a portion of top surface 22 of electrical component 14. In some examples, heat spreader 102 may be placed over substantially the entire top surface 22 of electrical component 14. During operation, thermal energy may transfer from electrical component 14 across top surface 22 to heat spreader 102 through TIM 16, whereupon the thermal energy may conductively dissipate in the x-y plane prior to transferring to TIM 102.

Heat spreader 102 may fabricated from one or more thermally conductive materials. In some examples, heat spreader 102 may be fabricated from copper, aluminum, nickel, or alloys or combinations thereof. Heat spreader 102 may define any size and shape suitable for spreading heat generated by electrical component 14. For instance, in some examples, heat spreader 102 may define a thickness (i.e., in the z-direction) between approximately 0.050 inches (i.e., 50 mils) and approximately 0.1 inches (i.e., 100 mils). It is appreciated, however, that the foregoing dimensions and materials are only examples, and the assemblies of the disclosure are not limited with respect to heat spreader 102.

Heat spreader 102 is thermally connected to second TIM 104, and may function to conductively transfer heat between top surface 22 of electrical component 14 and thermal bridge 20. In some examples, second TIM 104 may function to transfer thermal energy from the z-direction in FIG. 4 to the x-y plane of thermal bridge 20. As such, second TIM 104 may, in some examples, extend at least partially into at least one of vias 26 of thermal bridge 20 (i.e., in the z-direction illustrated on FIG. 4). In other examples, second TIM 104 may extend fully through the at least on via 26 of thermal bridge 20, e.g., so a portion of second TIM 104 is flush with or extending past a top surface of thermal bridge 20. By extending at least partially into the at least one via 26 of thermal bridge 20, TIM 104 may provide a direct thermal pathway in the z-direction across the bottom surface plane of thermal bridge 20, as well as provide for thermal energy transfer through the sidewalls of vias, e.g., in a plane substantially orthogonal to the z-direction. In this manner, thermal energy may readily transfer from top surface 22 of electrical component 14 through a z-direction thermal pathway defined by second TIM 104 and into the x-y plane of thermal bridge 20. By contrast, without second TIM 104 extending at least partially into the at least one via 26, thermal energy may be transferred to a bottom surface of thermal bridge 20, which may necessitate thermal diffusion in the z-direction of thermal bridge 20 as well in the x- and y-directions of thermal bridge 20. As a result, the rate of thermal energy transfer into thermal bridge 20 may be comparatively slower than instances in which second TIM 104 extends at least partially into vias 26 of thermal bridge 20. In any event, TIM 104 need not extend into vias 26 of thermal bridge 20 in order to thermally connect with thermal bridge 20, and the disclosure is not limited in this regard.

Second TIM 104 may be arranged in a variety of locations in assembly 100 including, e.g., on top surface 22 of electrical component 14 and/or a top surface of heat spreader 102 (e.g., a surface facing thermal bridge 20), as in FIG. 4. In some examples, second TIM 104 may be is disposed directly adjacent a top surface of heat spreader 102. In other examples, second TIM 104 is placed over one or more additional features which may include, e.g., one or more additional thermally conductive members and/or one or more additional TIM materials or TIM layers, one of which is in turn disposed directly adjacent to a top surface of heat spreader 102. TIM 104 may be placed over substantially the entire top surface of heat spreader 102. Alternatively, TIM 104 may be placed over a lesser portion of a top surface of heat spreader 102.

While TIM 104 can comprise any suitable thermally conductive material, in general, higher thermal conductivity materials increase heat transfer rates away from electrical component 14. TIM 104 may comprise the same material or combination of materials used to form TIM 16, as described above with respect to FIG. 1. In some examples, TIM 104 may include, but is not limited to, thermally enhanced epoxies, gels, greases, putties, and compressible pads. In some examples, the foregoing materials may fall within a class of materials called TIM-2 materials. Therefore, TIM 104 may, in some examples, be considered to include all TIM-2 materials. It should be appreciated, however, that other thermal interface materials are contemplated as being suitable for assembly 100.

Although second TIM 104 may extend at least partially, and in some case fully, through the at least one via 26 of thermal bridge 20, e.g., for improved heat transfer as outlined above, second TIM 104 may nevertheless be considered to define a z-axis thickness between a top surface of heat spreader 102 and a bottom surface of thermal bridge 20. For example, second TIM 104 in the example of FIG. 4 defines thickness 106 in the z-direction shown in FIG. 4 between a top surface of heat spreader 102 and a bottom surface of thermal bridge 20. Thickness 106 may vary based on a variety of different factors including, e.g., the geometry of electrical component 14 and thermal bridge 20, the spacing between electrical component 14 and thermal bridge 20, and the tolerances associated with assembly 100. However, in some examples, thickness 106 of TIM 104 may be between approximately 0.001 inches (i.e., 1 mil) and approximately 0.050 inches (i.e., 50 mil), such as, e.g., between approximately 0.025 inches and approximately 0.045 inches, or between approximately 0.030 inches and approximately 0.040 inches. It should be noted though that other thicknesses may be used in assembly 100.

As with assembly 10, assembly 100 may also be configured to facilitate thermal transfer from a sidewall (e.g., a sidewall defined in the z-x or z-y planes of FIG. 5), bottom surface, or different surface of electrical component 14 in additional to, or in lieu of, topside thermal transfer. For example, arrow 112 in FIG. 5 indicates that thermal energy may transfer from electrical component 14 into printed board 12 across the bottom surface of printed board 12 during the operation of electrical component 14, whereupon the thermal energy can transfer away from electrical component 14 and dissipate. In this manner, assembly 100 may provide for multiple different thermal pathways for conductively transferring heat away from electrical component 14. It should be appreciated, however, that the foregoing description of thermal pathways are only examples, and the assemblies of the disclosure are not limited to any particular configuration of thermal conduction pathways.

A variety of different techniques may be used to form an assembly according to the present disclosure. FIG. 6 is a block flow diagram illustrating an example technique for forming an electrical component assembly that includes one or more thermally conductive member and a thermal bridge including one or more vias. For ease of illustration, the technique of FIG. 6 is described with regard to assembly 10 shown in FIGS. 1 and 2. However, the example technique may be utilized to form any suitable electric component assembly.

Figure 6:
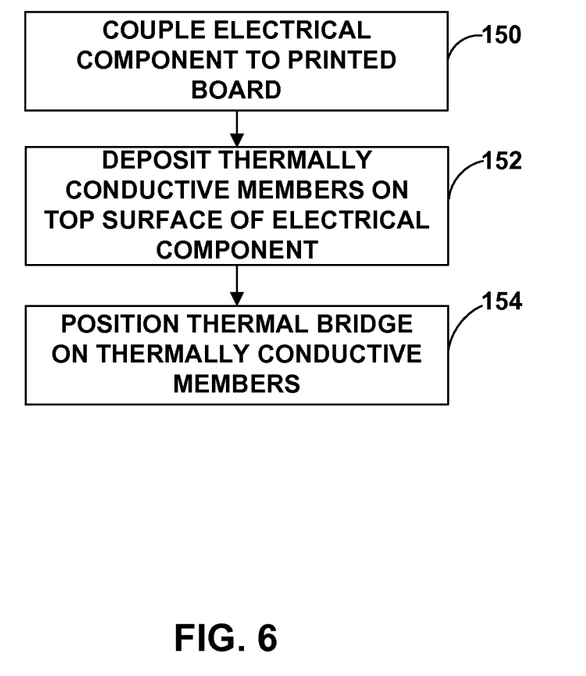
FIG. 6 is a block flow diagram illustrating an example technique for forming an example electrical component assembly including an example thermal bridge and an example thermally conductive member.

According to the example technique of FIG. 6, electrical component 14 may be mechanically coupled to printed board 12 (150). Then thermally conductive members (TIM 16 and thermal connector 18 in the example of FIG. 1) may be deposited on top surface 22 of electrical component 14 (152). Alternatively, electrical component 14 may be mechanically coupled to printed board 12 (150) after TIM 16 and thermal connector 18 are deposited on top surface 22 of electrical component 14 (152).

As described above, the thermally conductive member may be a thermal interface material (TIM), a thermal connector, a heat spreader, or a different thermally conductive member configured to transfer thermal energy from a top surface of the electrical component to a thermal bridge. The thermally conductive member may be fabricated from a variety of different thermally conductive materials including, e.g., a thermally isotropic material. In some examples, a combination of several different thermally conductive members can be used together. In these examples, the step of placing a thermally conductive member over an electrical component (152) may, in fact, involve placing a first thermally conductive member over an electrical component, placing a second thermally conductive member over an electrical component (e.g., on the first thermally conductive member), and so on.

In the example of FIG. 6 for instance, a thermal interface material may be deposited over an electrical component (150) in addition to placing a thermally conductive member over the electrical component (152). Through this process, at least two thermally conductive members may be placed over an electrical component: a thermal interface material and another thermally conductive member. It should be appreciated, therefore, that although the step of placing a thermally conductive member may itself include depositing a thermal interface material, in some assemblies, fabrication may include both depositing a thermal interface material over an electrical component and placing a thermally conductive member over an electrical component, as in the example method of FIG. 6.

As shown in FIG. 6, following the deposition of TIM 16 and thermal connector 18, thermal bridge 20 may be positioned on the electrical component (154). As described above, in some examples, thermal bridge 20 may be fabricated from a thermally orthotropic material. In other examples, thermal bridge 20 may be fabricated from a thermally isotropic material. In either set of examples, thermal bridge includes one or more vias 26 extending at least partially through thermal bridge 20 in the z-direction. Additionally, in some examples, vias 26 may be plated with a thermally conductive material.

Positing thermal bridge 20 over TIM 16 and thermal connector 18 (154) may include placing thermal bridge 20 such that protrusions 24 of thermal connector 18 extend at least partially (e.g., substantially fully) through at least one via 26 of thermal bridge 20. In particular, with respect to assembly 10 in FIG. 1, positioning thermal bridge 20 on thermal connector 18 (154) may involve inserting projections 24 into vias 26 of thermal bridge 20 such that projections 24 extend at least partially, and in some cases fully, through vias 26. As another example, with respect to assembly 100 in FIG. 4, thermal bridge 20 may be pressed onto second TIM 104 such that at least a portion of second TIM 104 flows into the plurality of vias 26 to extend at least partially, and in some cases fully, through vias 26 of thermal bridge 20.

It is appreciated that the method of FIG. 6 does not require a specific order of assembly. For example, in some cases, the step of positioning thermal bridge 20 over the thermally conductive member(s) (154) may be carried out before the thermally conductive member(s) are deposited on top surface 22 of electrical component 14 (152). For example, with further reference to assembly 100 in FIG. 4, thermal bridge 20 may be placed over electrical component 14 prior to placing second TIM 104 over electrical component 14. Subsequently, second TIM 104 may be deposited (e.g., through the at least one via 26 of thermal bridge 20) or otherwise placed over electrical component 14. Alternative assembly techniques may be applied to fabricate an assembly.

Fabrication of an assembly according to the disclosure may involve additional or different steps other than those outlined above with respect to FIG. 6, as will be appreciated by those of skill in the art. For example, technique of FIG. 6 may be modified according to the specific number and arrangement of thermally conductive members included in an assembly. As one example, fabrication of an assembly may include attaching a thermally conductive member to at least via of a thermal bridge. The thermally conductive member may be inserted such that the thermally conductive member extends at least partially, and in some cases fully, through the at least one via of a thermal bridge. Further, an attachment agent, such as, e.g., solder, thermal adhesive, or the like, may be applied to mechanically couple the thermally conductive member to the thermal bridge. Independent of the specific fabrication technique employed, some example assemblies of the present disclosure may provide efficient thermal transfer out of an electrical component.

Various examples have been described. These and other examples are within the scope of the following claims.

The invention claimed is:

1. An assembly comprising:
    a printed board;
    an electrical component on the printed board, the electrical component defining a first surface adjacent the printed board and one or more second surfaces other than the first surface;
    a thermal bridge comprising a plurality of vias extending at least partially through the thermal bridge;
    a heat sink separate from the printed board and thermally coupled to the thermal bridge; and
    a thermally conductive member interposed between the one or more second surfaces of the electrical component and the thermal bridge, wherein the electrical component is between the thermal bridge and the printed board, and wherein the thermal bridge is configured to transfer heat away from the electrical component to the heat sink.

2. The assembly of claim 1, wherein the thermally conductive member comprises a thermal connector, the thermal connector comprising a plurality of projections extending at least partially through the plurality of vias of the thermal bridge.

3. The assembly of claim 2, wherein the thermal connector comprises at least one of copper, a copper alloy, tin plated copper, or nickel plated copper.

4. The assembly of claim 2, wherein the vias comprise plated thermal vias.

5. The assembly of claim 4, wherein the plurality of projections are solder attached to the plurality of vias.

6. The assembly of claim 2, further comprising a thermal interface material interposed between the one or more second surfaces of the electrical component and the thermal connector, wherein the plurality of projections comprise a plurality of substantially cylindrical pegs, and the plurality of vias comprise a plurality of vias each defining a substantially circular cross-section.

7. The assembly of claim 6, wherein the thermal interface material defines a thickness between approximately 0.0005 inches and approximately 0.005 inches.

8. The assembly of claim 1, wherein the thermally conductive member comprises a thermal interface material.

9. The assembly of claim 8, wherein the thermal interface material extends at least partially through the plurality of vias.

10. The assembly of claim 8, wherein the thermal interface material defines a thickness between approximately 0.025 inches and approximately 0.045 inches.

11. The assembly of claim 8, further comprising a heat spreader interposed between the one or more second surfaces of the electrical component and the thermal interface material.

12. The assembly of claim 11, wherein the thermal interface material comprises a first thermal interface material, and further comprising a second thermal interface material interposed between the one or more second surfaces of the electrical component and the heat spreader.

13. The assembly of claim 1, wherein the thermal bridge is thermally orthotropic.

14. The assembly of claim 13, wherein the thermally conductive member is thermally isotropic.

15. The assembly of claim 13, wherein the thermal bridge comprises a carbon fiber material.

16. An assembly comprising:
    a printed board;
    an electrical component on the printed board, the electrical component defining a first surface adjacent the printed board and one or more second surfaces other than that of the first surface;
    a thermal bridge comprising a plurality of vias extending through the thermal bridge, the thermal bridge comprising a thermally orthotropic material, and the plurality of vias comprising plated vias;
    a thermal connector comprising a plurality of projections extending at least partially through the plurality of vias, the thermal connector comprising a thermally isotropic material; and
    a thermal interface material interposed between the top surface of the electrical component and the thermal connector.

17. The assembly of claim 1, wherein the heat sink includes a mounting member configured to mount the assembly in an electrical device.

18. A method comprising forming an assembly, the assembly comprising:
    a printed board;
    an electrical component on the printed board, the electrical component defining a first surface adjacent the printed board and one or more second surfaces other than the first surface;
    a thermal bridge comprising a plurality of vias extending at least partially through the thermal bridge;
    a heat sink separate from the printed board and thermally coupled to the thermal bridge; and
    a thermally conductive member interposed between the one or more second surfaces of the electrical component and the thermal bridge, wherein the electrical component is between the thermal bridge and the printed board, and wherein the thermal bridge is configured to transfer heat away from the electrical component to the heat sink.

19. The method of claim 18, wherein forming the assembly comprises:
    placing the thermally conductive member over the electrical component on the printed board; and
    placing the thermal bridge over the electrical component.

20. The method of claim 18, wherein the thermal bridge is thermally orthotropic.

* * * * *